US011269037B2

(12) United States Patent
Doneva et al.

(10) Patent No.: US 11,269,037 B2
(45) Date of Patent: Mar. 8, 2022

(54) MR IMAGING USING MOTION-DEPENDENT RADIAL OR SPIRAL K-SPACE SAMPLING

(71) Applicant: KONINKLIJKE PHILIPS N.V., Eindhoven (NL)

(72) Inventors: Mariya Ivanova Doneva, Hamburg (DE); Jan Hendrik Wulbern, Hamburg (DE); Gabriele Marianne Beck, Venlo (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/754,771

(22) PCT Filed: Oct. 5, 2018

(86) PCT No.: PCT/EP2018/077181
§ 371 (c)(1),
(2) Date: Apr. 9, 2020

(87) PCT Pub. No.: WO2019/072719
PCT Pub. Date: Apr. 18, 2019

(65) Prior Publication Data
US 2020/0300952 A1 Sep. 24, 2020

(30) Foreign Application Priority Data
Oct. 10, 2017 (EP) .................... 17195606

(51) Int. Cl.
*G01R 33/567* (2006.01)
*G01R 33/48* (2006.01)
*G01R 33/561* (2006.01)

(52) U.S. Cl.
CPC ....... *G01R 33/567* (2013.01); *G01R 33/4826* (2013.01); *G01R 33/5611* (2013.01)

(58) Field of Classification Search
CPC ............. G01R 33/567; G01R 33/4826; G01R 33/5611; G01R 33/5673; G01R 33/5676; G01R 33/4824
(Continued)

(56) References Cited

U.S. PATENT DOCUMENTS 7,039,451 B1 5/2006 Jhooti et al.
2008/0054899 A1* 3/2008 Aksoy ................ G01R 33/5611
324/307
(Continued)

FOREIGN PATENT DOCUMENTS

WO 2013159044 A1 10/2013
WO 2016069602 A1 5/2016
(Continued)

OTHER PUBLICATIONS

Feng et al "XD-GRASP: Golden Angle Radial MRI with Reconstruction of Extra Motion-State Dimensions Using Compressed Sensing" Magnetic Resonance in Med. vol. 75, No. 2, Mar. 25, 2015 p. 775-788.
(Continued)

*Primary Examiner* — Christopher P McAndrew

(57) ABSTRACT

The invention relates to a method of MR imaging of an object (10) placed in an examination volume of a MR device (1). It is an object of the invention to enable MR imaging using a radial (or spiral) acquisition scheme with a reduced level of motion artefacts. The method of the invention comprises the following sequence of steps: —detecting a momentary motion—induced displacement (Δ) of the object (10); —attributing the detected displacement (A) to a motion state (M1-M5), each motion state (M1-M5) corresponding to one of a plurality of contiguous ranges of displacements (Δ); —determining angular coordinates of a radial or spiral k-space profile by incrementing the angular coordinates individually for each motion state (M1-M5) starting from
(Continued)

M1     M2     M3     M4     M5     M1-M5 combined initial angular coordinates; —acquiring the k-space profile; —repeating steps a-d a number of times; and —reconstructing an MR image from at least the k-space profiles attributed to one of the motion states (M1-M5). Moreover, the invention relates to a MR device (1) for carrying out this method as well as to a computer program to be run on a MR device (1).

12 Claims, 2 Drawing Sheets

(58) Field of Classification Search
USPC .......................................................... 324/309
See application file for complete search history.

(56) References Cited

U.S. PATENT DOCUMENTS

| | | | |
|---|---|---|---|
| 2009/0116761 A1* | 5/2009 | Wheaton | A61B 5/7292 382/254 |
| 2012/0235679 A1* | 9/2012 | Xue | G01R 33/56509 324/307 |
| 2015/0077112 A1 | 3/2015 | Otazo et al. | |
| 2015/0276909 A1 | 10/2015 | Kawaji et al. | |
| 2015/0309135 A1 | 10/2015 | Axel et al. | |
| 2016/0104279 A1 | 4/2016 | Li et al. | |
| 2016/0324500 A1 | 11/2016 | Fan et al. | |
| 2017/0035298 A1 | 2/2017 | Contijoch et al. | |
| 2017/0332981 A1 | 11/2017 | Witschey et al. | |
| 2018/0149721 A1 | 5/2018 | Beck | |

FOREIGN PATENT DOCUMENTS

| | | | | |
|---|---|---|---|---|
| WO | WO-2016069602 A1 * | 5/2016 | ........... | A61B 5/0044 |
| WO | 2017173437 A1 | 10/2017 | | |

OTHER PUBLICATIONS

International Search Report from PCT/EP2018/077181 dated Jan. 21, 2019.
Davide Piccini et al., "Four-Dimensional Respiratory Motion-Resolved Whole Heart Coronary MR Angiography" Magnetic Resonance in Med. 77 p. 1473-1484 (2017).
Simone Coppo et al., "Free-Running 4D Whole-Heart Self-Navigated Golden Angle MRI: Initial Results" Magnetic Resonance in Medicine 74 p. 1306-1316 (2015).
Christopher M. Rank et al., "4D Respiratory Motion-Compensated Image Reconstruction of Free-Breathing Radial MR Data With Very High Undersampling" Magnetic Resonance in Med. vol. 77 p. 1170-1183 (2017).
Ziwu Zhou et al.,"Golden-Ratio Rotated Stack-of-Stars Acquisition for Improved Volumetric MRI" Magnetic Resonance in Med. (2017).
Jhooti P, et al. "Phase Ordering With Automatic Window Selection . . . " MRM. 2000; 43:470-80.
Bhat, et al. "3D Projection Reconstruction based Respiratory Motion Correction Technique for Free Breathing Coronary MRA" Proc. Intl. Soc. Mag. Reson. Med. vol. 18 p. 669 (2010).
Winkelmann S et al, "An Optimal Radial Profile Order Based on the Golden Ratio of Time Resolved MRI" IEEE Trans Med Imag 26:68-76.
Chan R et al. "Multidimensional Golden Means for 3D-PR in Dynamic MRI" ISMRM Workshop Non Cart Imaging 2007.
Wuelbern JH et al. Improved Reconstruction of Free Breathing Abdominal Imaging Using non-Cartesian Iterative Reconstruction and Elastic Image Registration: ISMRM 2017.

* cited by examiner

MR IMAGING USING MOTION-DEPENDENT RADIAL OR SPIRAL K-SPACE SAMPLING

CROSS REFERENCE TO RELATED APPLICATIONS

This application is a U.S. national phase application of International Application No. PCT/EP2018/077181 filed on Oct. 5, 2018, which claims the benefit of EP Application Serial No. 17195606.3 filed on Oct. 10, 2017 and is incorporated herein by reference.

FIELD OF THE INVENTION

The invention relates to the field of magnetic resonance (MR) imaging. It concerns a method of MR imaging of an object. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for imaging of soft tissue they are superior to other imaging methods in many respects, do not require ionizing radiation and are usually not invasive.

According to the MR method in general, the object, for example the body of the patient to be examined, is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle) 90°.

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

To realize spatial resolution in the body, constant magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The signal data obtained via the receiving coils corresponds to the spatial frequency domain and is called k-space data. The k-space data usually includes multiple lines acquired with different phase encoding. Each line is digitized by collecting a number of samples. A set of k-space data is converted to a MR image by means of an image reconstruction algorithm.

In the known so-called three-dimensional (3D) stack-of-stars acquisition scheme (see, e.g., WO 2013/159044 A1), a number of spatially non-selective or slab-selective RF excitations is applied, each followed by the acquisition of one or more MR signals (e.g. gradient echo signals), wherein each MR signal represents a k-space profile. The MR signals are acquired as radial k-space profiles from a number of parallel slices. The slices are arranged at different positions along a slice direction. In the slice direction (e.g. the $k_z$-direction) standard Cartesian phase-encoding is performed, while the MR signals are acquired within each single slice along radial "spokes" that are rotated around the center ($k_x=k_y=0$). This results in a cylindrical k-space coverage composed of stacked discs ("stack-of-stars"). Technically, this is realized by generating magnetic field gradients in the in-plane directions of the slices simultaneously and modulating their amplitudes. Different schemes can be used for selecting the temporal order of the k-space profile acquisition steps. E.g., all phase-encoding steps along the slice direction can be acquired sequentially before k-space profiles at different angular positions are acquired. This ensures that periods of Cartesian sampling are kept short, which leads to high data consistency within the stack of slices and preserves the general motion-robustness of radial sampling for the stack-of-stars approach. The Cartesian phase-encoding steps may be performed from the center slice to the k-space periphery (centric out), or in linear order from $-k_{z,\,max}$ to $+k_{z,\,max}$. For the angular ordering, the imaging sequence can use either equidistant angular sampling with multiple interleaves or the so-called golden angle-scheme. In the equidistant scheme, the angular distance is calculated according to $\Delta\Phi=180°/n_{total}$ where $n_{total}$ is the total number of spokes. It may be beneficial to acquire the spokes using multiple interleaves (or "rotations") because the interleaving reduces temporal coherences in k-space. Thus, motion inconsistencies are spread out in k-space and artefacts are attenuated. In the golden angle-scheme, the angle of the k-space profile is incremented each time by $\Delta\Phi=111.25°$, which corresponds to 180° multiplied by the golden ratio. Also known are so-called pseudo golden angle and tiny golden angle schemes, which are herein all regarded as falling under the general term "golden angle-scheme". In such golden angle-schemes, subsequently sampled spokes always add complementary information while filling the largest gaps within the previously sampled set of spokes. As a consequence, any sequential set of acquired spokes covers k-space approximately uniformly, which enables reconstruction of temporal sub-frames and makes the golden-angle scheme well-suited for dynamic imaging studies.

The afore-described 3D radial stack-of-stars scheme offers several promising advantages for clinical MR imaging like benign aliasing artifacts and a continuous updating of k-space center. However, although its intrinsic motion-robustness, the acquired MR images may still be affected to a certain extent by motion.

To overcome this difficulty, gating techniques have been developed accepting only MR signal data acquired within a certain predefined respiratory gating window. To cope with potential drift problems, a multi-gating window approach (referred to as PAWS, see U.S. Pat. No. 7,039,451 B1) has been proposed using a number of individual motion states (bins) rather than one pre-defined gating window. Each of the motion states corresponds to one of a plurality of contiguous ranges of motion-induced displacements of the body under examination. The final MR image in PAWS is reconstructed from the MR signal data attributed the motion state for which a complete set of MR signal samples is acquired first. All other MR signal data are then discarded.

It is further known that MR signal data of a radial acquisition in combination with a golden angle-scheme may be retrospectively attributed to motion states similar to the PAWS approach. An MR image may then be reconstructed from the MR signal data attributed to the motion state for which the largest amount of MR signal data has been acquired. Alternatively, a constrained reconstruction may be applied which simultaneously reconstructs MR images for all motion states using the correlations between the different motion states. This approach utilizes all acquired data leading to 100% scan efficiency.

Although golden angle sampling provides quasi-uniform angular distribution of radial k-space profiles within an arbitrary acquisition interval, the MR signal data attributed to each respiratory motion state are not necessarily well distributed. There is no guarantee that combining MR signal data from multiple time intervals will results in well distributed angular sampling of the acquired radial k-space profiles. A potential clustering and large gaps between the radial profiles may reduce the image quality of the reconstructed MR images.

The international application WO2016/069602 concerns an adaptive real time radial k-space sampling trajectory (ARKS). The ARKS-acquisition responds to a physiologic feedback signal to reduce motion effects. Instructions to a acquire a new radial projection are sent from the physiological signal analysis.

SUMMARY OF THE INVENTION

From the foregoing it is readily appreciated that there is a need for an improved MR imaging technique. It is an object of the invention to enable MR imaging using a radial (or spiral) acquisition scheme with a reduced level of motion artefacts.

In accordance with the invention, a method of MR imaging of an object placed in an examination volume of a MR device is disclosed. The method comprises the following sequence of steps:

detecting a momentary motion-induced displacement of the object;

attributing the detected displacement to a motion state, each motion state corresponding to one of a plurality of contiguous ranges of displacements;

determining angular coordinates of a radial or spiral k-space profile by incrementing the angular coordinates individually for each motion state starting from initial angular coordinates and a different initial angular coordinate is attributed to each motion state;

acquiring the k-space profile;

repeating steps a-d a number of times; and reconstructing an MR image from at least the k-space profiles attributed to one of the motion states.

The invention proposes to continuously detect the motion of the body of the examined patient during MR signal acquisition. The momentary motion-induced displacement may be detected, e.g., by acquiring a navigator signal (e.g. from a pencil-beam shaped volume positioned over the diaphragm of the patient to detect the momentary respiratory phase). Alternatively, the momentary motion-induced displacement may be detected by using a motion sensor, such as a camera, an ECG sensor, or a respiratory bellow. Furthermore, the intrinsic motion information of the already available acquired MR signal data may be used to derive the momentary motion phase. Each radial or spiral k-space profile (going through the origin of k-space) provides a one-dimensional 'intrinsic' navigator. The momentary motion-induced displacement may be derived from such intrinsic navigator signals.

A k-space profile within the meaning of the invention is an MR signal acquired along a given (radial or spiral) trajectory in k-space. The k-space profiles may be acquired in a two- or three-dimensional fashion.

The motion-dependent radial or spiral k-space sampling approach of the invention can advantageously be combined with a stack-of-stars or stack-of-spirals acquisition strategy, wherein the radial or spiral k-space profiles are acquired from a number of parallel slices arranged at adjacent positions along a slice direction perpendicular to the plane in which the k-space profiles are rotated.

K-space profiles acquired in the known PROPELLER imaging technique are also considered as radial k-space profiles within the meaning of the present invention. In the PROPELLER concept, MR signals are acquired in k-space in N strips, each consisting of L parallel k-space profiles, corresponding to the L lowest frequency phase-encoding lines in a Cartesian-based k-space sampling scheme. Each strip, which is also referred to as k-space blade, is rotated in k-space by a rotation angle of, for example, 180°/N or the golden angle, so that the total set of MR signals spans a circle in k-space. Within the meaning of the invention, a radial k-space profile may thus equally be a k-space blade.

Alternatively, radial k-space profiles may be acquired that are distributed isotropically over a sphere ("Koosh ball").

Spiral k-space profiles within the meaning of the invention also encompass so-called phyllotactic spiral k-space trajectories.

Correspondingly, the angular coordinates within the meaning of the invention may be defined as a rotation angle (in the case of a two-dimensional or stack-of-stars or stack-of-spirals acquisition) or as a set of polar and azimuthal rotation angles (in the case of a "Koosh ball"-type acquisition).

According to the invention, similar to the known PAWS technique, the detected momentary motion-induced displacement is attributed to one of a number of motion states. The distribution of the radial or spiral k-space profiles attributed to each motion state is improved by the invention by controlling the k-space acquisition depending on the motion state. To this end, the angular coordinates of the respective k-space profile to be acquired is determined by individual incrementation for each motion state. In other words, book keeping of the angular coordinates of the already acquired k-space profiles is performed for each motion state and a decision for the next k-space profile is made based on the detected motion. This enables an improved (complete) distribution of k-space profiles within each motion state such that the quality of the finally reconstructed MR image is improved. Further, different initial angular coordinates in k-space may be used for each motion state which achieves a more efficient sampling of k-space. It is found that the sampling approach of the invention is able to better deal with extreme motion states, e.g. irregular in time or involving larger displacements.

In a possible embodiment, the angular coordinates of the k-space profiles are incremented according to a golden angle scheme to obtain a uniform k-space coverage. Therein, a different initial angular coordinate may be used for each motion state. This approach is advantageous for a multi-motion state reconstruction that utilizes, e.g., the correlations between different respiratory states. This is because the different initial rotation angles ensure that there is no repetition of angular positions between k-space profiles attributed to different motion states.

In one possible embodiment of the invention, the above steps a-d are repeated until the total acquired k-space profiles attributed to at least one of the motion states span a sufficiently densely sampled circular (or spherical) region in k-space to reconstruct the MR image therefrom.

The proposed adaptive k-space sampling scheme may be used, e.g., to obtain a golden angle sampling pattern in each individual motion state. MR image reconstruction may be performed either on the MR signal data attributed to the motion state for which the maximum number of k-space profiles has been acquired only or on the MR signal data of each motion state individually. The latter case will yield images with increasing (streaking) artefacts level as the number of profiles decreases. To mitigate this effect, k-space profiles of to two or more motion states may be combined in image reconstruction as the method of the invention can be performed to ensure quasi uniform k-space coverage when combining k-space profiles from different motion states, as explained above.

In a possible embodiment, a single MR image may be reconstructed from the k-space data of all motion states simultaneously using a regularization term that exploits the correlations between the different motion states.

According to another possible embodiment, an individual MR image is reconstructed for each of at least two of the motion states, wherein the individual MR images are combined into a final MR image using an appropriate (elastic) registration algorithm to correct for the motion-induced displacements between the motion states. In this embodiment, the individual single motion state MR images are fused in the image domain into a single artefact-free clinical MR image of high image quality.

The method of the invention may be combined in a straight-forward fashion with conventional view sharing, keyhole, or k-t sampling techniques. The k-space profiles may be acquired and reconstructed into the MR image using acceleration techniques such as half scan, or parallel imaging techniques like (non-cartesian) SENSE.

The MR signal data attributed to a particular motion state may be undersampled in the method of the invention, at least in the periphery of k-space. Hence, compressed sensing (CS) may advantageously be used for reconstruction of the MR image. The theory of CS is known to have a great potential for significant signal data reduction. In CS theory, a signal data set which has a sparse representation in a transform domain can be recovered from undersampled measurements by application of a suitable regularization algorithm. As a mathematical framework for signal sampling and reconstruction, CS prescribes the conditions under which a signal data set can be reconstructed exactly or at least with high image quality even in cases in which the k-space sampling density is far below the Nyquist criterion, and it also provides the methods for such reconstruction (see M. Lustig et al., "Compressed sensing MRI", IEEE signal processing magazine, 2008, vol. 25, no. 2, pages 72-82).

The method of the invention described thus far can be carried out by means of a MR device including at least one main magnet coil for generating a uniform static magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit for reconstructing a MR image from the received MR signals. The method of the invention can be implemented, for example, by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
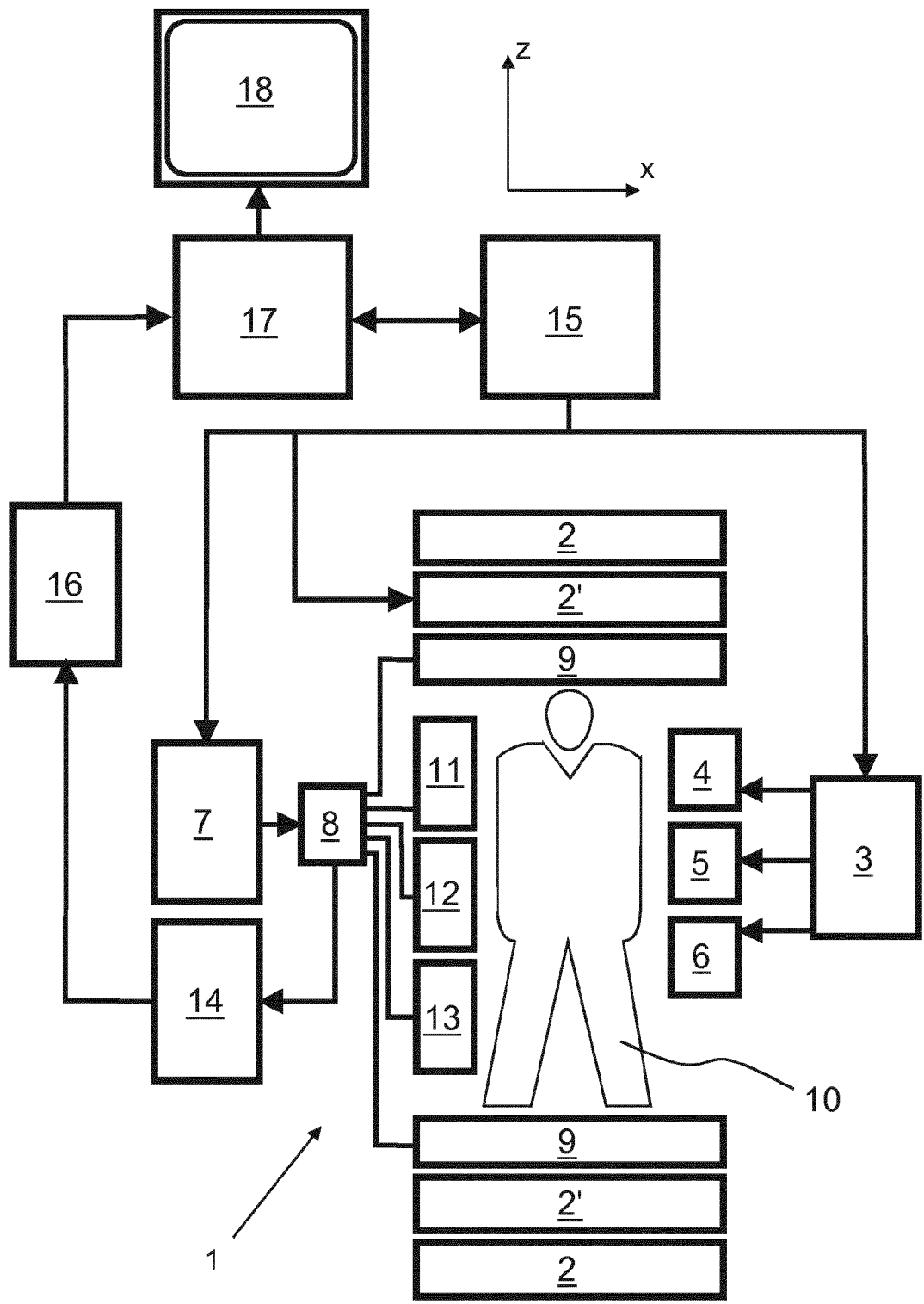
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the whole-body volume RF coil 9.

For generation of MR images of limited regions of the body 10, a set of local array RF coils 11, 12, 13 are placed contiguous to the region selected for imaging. The array coils 11, 12, 13 can be used to receive MR signals induced by body-coil RF transmissions.

The resultant MR signals are picked up by the whole body volume RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the gradient pulse amplifier 3 and the transmitter 7 to generate any of a plurality of MR imaging sequences, such as echo planar imaging (EPI), echo volume imaging, gradient and spin echo imaging, fast spin echo (TSE) imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

Figure 2:
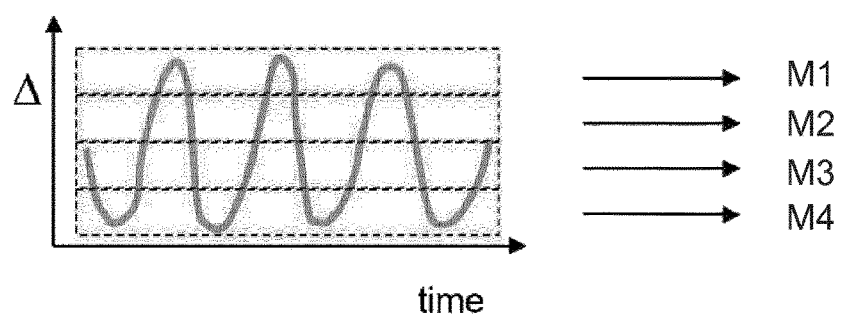
FIG. 2 shows a diagram illustrating the PAWS gating scheme adopted according to the invention.
Figure 3:
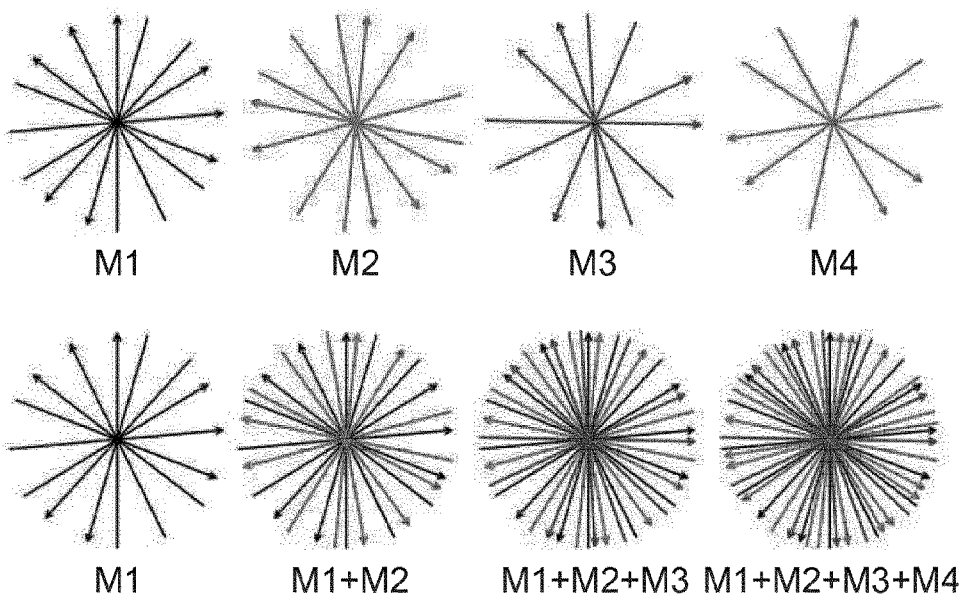
FIG. 3 illustrates a first embodiment of the motion-dependent radial k-space acquisition strategy of the invention.
Figure 4:
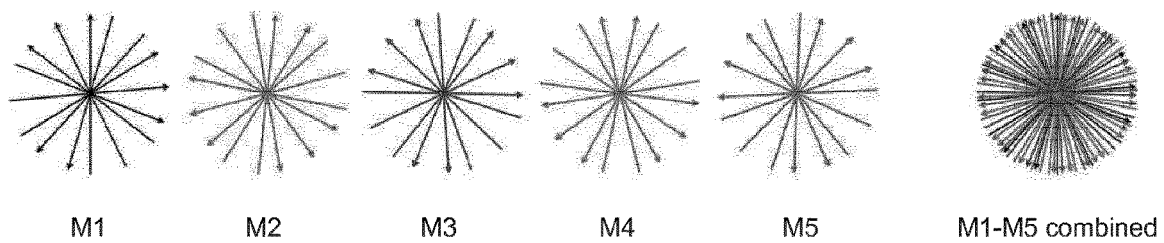
FIG. 4 illustrates a second embodiment of the motion-dependent radial k-space acquisition strategy of the invention.

With continuing reference to FIG. 1 and with further reference to FIGS. 2-4, embodiments of the imaging approach of the invention are explained.

FIG. 2 illustrates the known PAWS gating scheme which is adopted according to the invention. A respiration navigator signal is detected using the MR imaging apparatus 1 shown in FIG. 1. A momentary motion-induced displacement $\Delta$ of the body 10 is derived from the navigator signal. In the depicted embodiment, the displacement $\Delta$ reflects the position of the patient's diaphragm and thus indicates the respiratory motion as a function of time. The detected displacement $\Delta$ is attributed to one of four motion states M1-M4. Each of the motion states M1-M4 corresponds to one of a plurality of contiguous ranges of the displacement $\Delta$.

FIG. 3 illustrates the radial k-space acquisition applied according to the invention. Before the acquisition of each radial k-space profile, the rotation angle of the respective k-space profile is determined depending on the motion state M1-M4 attributed to the detected momentary displacement $\Delta$. To this end, the rotation angle is incremented individually for each motion state. In a possible embodiment, the rotation angle is incremented for each of the subsequently detected motion states M1-M4 by $mN\psi$, wherein m (m=1 ... 4 in the depicted embodiment) is the index of the respective motion state, N is the maximum number of k-space profiles to be acquired per motion state, and $\psi$ is the golden angle. This scheme provides a uniform k-space sampling pattern in each of the motion state, wherein the k-space sampling pattern is different for each of the motion states. This is advantageous for a multi-respiratory frame reconstruction utilizing correlations between the different respiratory phases. This is because it is made sure that there is no repetition of rotation angles between the different motion states M1-M4. In the example shown in FIG. 3, the maximum number N of k-space profiles is acquired only for the first motion state M1. The higher motion states are only incompletely sampled. An MR image may be reconstructed only from the k-space profiles attributed to motion state M1. MR images may also be reconstructed from combinations M1+M2, M1+M2+M3, or M1+M2+M3+M4 of k-space data. As can be seen in FIG. 3, due to the adaptive sampling scheme of the invention, each of these combinations yields a quasi-uniform k-space coverage.

In the embodiment shown in FIG. 4, the same radial golden angle k-space sampling is applied as in the example of FIG. 3. However, in FIG. 4, the k-space profiles are attributed to five different motion states M1-M5. Moreover, the maximum number of N k-space profiles is acquired for each of the motion states M1-M5. FIG. 4 also shows the k-space data combined for all motion states M1-M5 which comprises the same number of k-space profiles for each motion state and no redundantly sampled rotation angles. This combined data is used for reconstruction of a clinical MR image of high quality. As in the example of FIG. 3, a constrained reconstruction is used which uses the correlations between the different motion states. The depicted approach utilizes all acquired data resulting in 100% scan efficiency.

The invention claimed is:

1. A method of MR imaging of an object placed in an examination volume of a MR device, the method comprising:
   (a) detecting a momentary motion-induced displacement ($\Delta$) of the object;
   (b) attributing the detected displacement ($\Delta$) to a motion state (M1-M5), each motion state (M1-M5) corresponding to one of a plurality of contiguous ranges of displacements ($\Delta$);
   (c) determining angular coordinates of a radial or spiral k-space profile by incrementing the angular coordinates individually for each motion state (M1-M5) starting from initial angular coordinates wherein different initial angular coordinates are attributed to each motion state (M1-M5);
   (d) acquiring the k-space profile;
   repeating steps a-d a number of times; and
   reconstructing an MR image from at least the k-space profiles attributed to one of the motion states (M1-M5).

2. The method of claim 1, wherein steps a-d are repeated until the total acquired k-space profiles attributed to at least one of the motion states (M1-M5) span a sufficiently densely sampled circular or spherical region in k-space to reconstruct the MR image therefrom.

3. The method of claim 1, wherein the radial k-space profiles are acquired from a number of parallel slices arranged at adjacent positions along a slice direction perpendicular to a plane in which the k-space profiles are rotated.

4. The method of claim 1, wherein the angular coordinates are incremented according to a golden angle scheme.

5. The method of claim 1, wherein the momentary motion-induced displacement ($\Delta$) is derived from k-space profiles acquired in a previous repetition as intrinsic navigator signals.

6. The method of claim 1, wherein the momentary motion-induced displacement ($\Delta$) is detected by acquiring a navigator signal.

7. The method of claim 1, wherein the momentary motion-induced displacement ($\Delta$) is detected by using a motion sensor.

8. The method of claim 1, wherein the MR image is reconstructed from the MR signals attributed to at least two of the motion states.

9. The method of claim 1, wherein an individual MR image is reconstructed for each of at least two motion states (M1-M5), wherein the individual MR images are combined into a final MR image using a registration algorithm to correct for the motion-induced displacements between the motion states (M1-M5).

10. The method of claim 1, wherein the MR image is reconstructed using non-cartesian SENSE or compressed sensing.

11. A magnetic resonance (MR) device including at least one main magnet coil for generating a uniform, static magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit for reconstructing a MR image from the received MR signals, wherein the MR device is configured to perform a method, the method comprising:
(a) detecting a momentary motion-induced displacement ($\Delta$) of the object (b) attributing the detected displacement ($\Delta$) to a motion state (M1-M5), each motion state (M1-M5) corresponding to one of a plurality of contiguous ranges of displacements ($\Delta$);
(c) determining angular coordinates of a radial or spiral k-space profile by incrementing the angular coordinates individually for each motion state (M1-M5) starting from initial angular coordinates wherein different initial angular coordinates are attributed to each motion state (M1-M5);
(d) acquiring the k-space profile;
repeating steps a-d a number of times; and
reconstructing an MR image from at least the k-space profiles attributed to one of the motion states (M1-M5).

12. A computer program to be run on a magnetic resonance (MR) device, which computer program comprises computer executable instructions stored on a non-transitory computer readable medium to perform a method, the method comprising:
(a) detecting a momentary motion-induced displacement ($\Delta$) of an object;
(b) attributing the detected displacement ($\Delta$) to a motion state (M1-M5), each motion state (M1-M5) corresponding to one of a plurality of contiguous ranges of displacements ($\Delta$);
(c) determining angular coordinates of a radial or spiral k-space profile by incrementing the angular coordinates individually for each motion state (M1-M5) starting from initial angular coordinates, wherein different initial angular coordinates are attributed to each motion state (M1-M5);
(d) acquiring the k-space profile;
repeating steps a-d a number of times; and
reconstructing an MR image from at least the k-space profiles attributed to one of the motion states (M1-M5).

* * * * *